Figure 1:
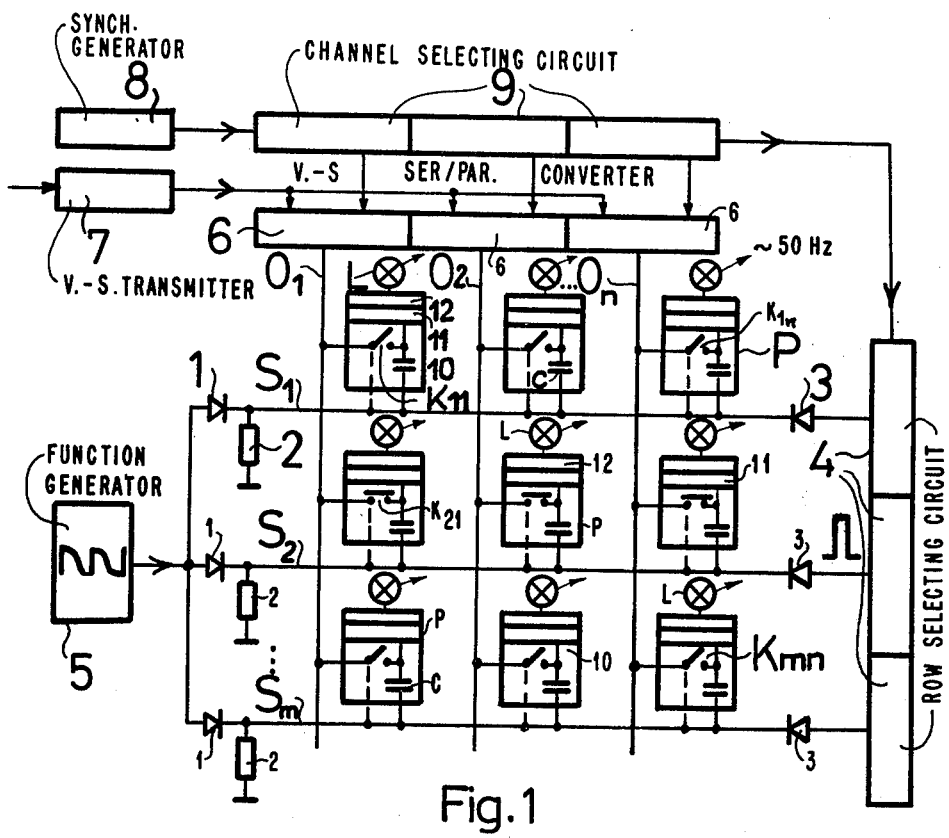

United States Patent [19]

Magos et al.

[11] 4,134,132
[45] Jan. 9, 1979

[54] CIRCUIT ARRANGEMENT FOR DISPLAY BOARDS HAVING LUMINOUS ELEMENTS ARRANGED IN A MATRIX

[75] Inventors: Gábor Magos; József Szalai, both of Budapest, Hungary

[73] Assignee: Villamos Berendezés és Készülék Művek, Budapest, Hungary

[21] Appl. No.: 802,473

[22] Filed: Jun. 1, 1977

[30] Foreign Application Priority Data

Jun. 29, 1976 [HU] Hungary .............................. VI 1087

[51] Int. Cl.² .......................... H04N 3/12; H05B 39/09
[52] U.S. Cl. ...................................... 358/240; 340/793; 340/166 R; 340/780
[58] Field of Search .................... 358/240; 340/166 R, 340/166 EL, 324 M; 315/169 R, 169 TV

[56] References Cited

U.S. PATENT DOCUMENTS

3,163,851  12/1964  Haan et al. ..................... 315/169 TV
3,609,747  9/1971  Ngo ................... 340/324 R Primary Examiner—John C. Martin

[57] ABSTRACT

Circuit arrangement for the shaded (gray-scale) displaying of images on display boards having individual luminous elements arranged in a matrix, wherein switching circuits of the luminous elements are connected to row and column bars, and each bar is coupled to a selecting circuit either directly or through a store element. Each switching circuit includes an analog memory, a comparator with a constant threshold level, and a power switch. The memory is preferably a capacitor which is connected — over a switching element — between the respective row bar and column bar. A function generator supplying a monotonously varying periodic signal is connected to the bars that are directly connected to the capacitors whereas a video-signal transmitter is connected to the bars that are linked to the switching elements.

7 Claims, 2 Drawing Figures

CIRCUIT ARRANGEMENT FOR DISPLAY BOARDS HAVING LUMINOUS ELEMENTS ARRANGED IN A MATRIX

The invention relates to a circuit arrangement for the shaded (gray-scale) displaying on display boards that comprise individual luminous elements arranged in a matrix, wherein the switching circuit of any individual element is connected to a row bar and to a column bar, and each bar is — directly or over a store element — coupled to a selecting circuit, and a video signal transmitter is coupled to the circuit arrangement.

In matrix display boards according to the prior art, which are fitted with individual luminous elements, these elements are generally incandescent lamps, with separate switching circuits being inserted in their supply lines. The input of such a switching circuit is coupled to a row bar and to a column bar, and the bars are coupled with selecting circuits either directly or over bistable store elements. The valve-like power switching elements of the switching circuits may generally be transistors, thyristors or Triacs, depending on the desired amount of power and the mode of the supply. The power switch may be coupled to a bistable store element but it may be of a type also performing the duty of a bistable store.

Most of the known matrix type display boards with individual luminous elements are energized in a manner as to supply all elements equally i.e. to the same brightness level. In this case the control operation (aside from filament preheating and assimilation to ambient light conditions) is restricted to the selection of the luminous elements that form the character to be displayed. Such display boards are not apt to display a gray-scale image.

There are already known in the prior art some solutions for the setting off of certain rows or arrays of the board (e.g. game scoreboards that display the most recent scores by energizing the individual luminous elements to a brighter level than those displaying previous scores). With such display boards the variation of the brightness level is obtained by changes in the supply voltage that is led to the rows or arrays.

Recently the prior art produced some boards that are apt to perform the displaying of shaded (gray-scale) images. According to one of the known solutions, a video signal supplied by a TV-camera is scanned to single image points and stored row by row into analog type store means, and then the selected incandescent lamps of a row in question are supplied over a row period — by high-power coordinate amplifier elements — with a voltage pulse of a value just appropriate to effect an average brightness of the lamp that, in accordance with the video signal, represents the brightness of the respective image point. It is a feature of this method that the on-load rate (the relative duration of the voltage pulse as compared with the whole row period) is very low, about 0.01, so that the amplitude of the voltage pulse amounts up to 10–15 times the rated voltage of the incandescent lamp. According to this solution no separate switching circuits or stores are applied for the individual luminous elements.

The most disadvantageous feature of this solution consists in the fact that the lamps soon become defective due to the pulse-like overload. The contrast obtainable in this way is not sufficient. A further disadvantage is the flicker effect that appears during the displaying in a disturbing manner.

According to another known solution the video signal is converted into a digital signal after a four-level brightness discrimination, and this signal controls the voltage supply of the selected lamps in a manner so that a uniform voltage is supplied but for different durations. In case of the dark state, no voltage is supplied whereas the lamp is energized for one time, two times or three times the duration unit if a low, medium or high brightness level should be displayed, respectively. It is a disadvantage of this solution that the number of brightness degrees is restricted by the flicker frequency which diminishes if the number of degrees is increased so that a four-level system (the fourth level is the dark state) works with a flicker frequency of only $16\frac{2}{3}$ Hz.

Studies made in TV technology testify that the visual impression of a continuous gray-scale image can be obtained if the number of brightness degrees approximates 100. A further pre-conditions for obtaining shaded image displays of good quality is the increase of the flicker frequency up to at least 50 Hz and a contrast rate of at least 100.

The present invention has been designed in order to establish a circuit arrangement for the shaded image display in matrix display boards comprising individual luminous elements, which makes it possible to perform a continuous (gray-scale) brightness control and to provide for a suitable contrast, highly reliable operation and a flicker frequency not lower than 50 Hz.

The invention is based on the concept that nearly the whole image period (20 msec) can be utilized for supplying the individual luminous elements if each separate value of the analog video signal, belonging to different luminous elements of the display board, is stored in appropriate switching circuits of these elements.

The invention is further based on the concept tha pulses of a length coherent to the values of the video signal amplitude, and suitable for controlling the power switches of the luminous elements, can in a simple and reliable manner be obtained if a signal representing a monotonously varying periodic function is coupled to the bars connected to the store elements of the switching circuits, and this signal is added to the signal memorized in the analog store or memory element, and then the signal obtained by the addition is coupled to the input of a comparator.

The solution of the object according to the invention is embodied in a circuit arrangement wherein individual switching circuits, coupled each to respective row and column bars, each comprise an analog store or memory, a comparator with a constant threshold level, coupled to the analog store, and a power switch coupled over its control input to the comparator. The analog store consists in a capacitor arranged between one of the bars — either the row bar or the column bar — and the input of the comparator, in a manner that a switching element is inserted between that terminal of the capacitor which is connected to the comparator and the other (row or column) bar. A function generator supplying a monotonously varying periodic signal is coupled to all bars that are directly connected to the capacitors whereas a video signal transmitter is coupled, either directly or over a video signal series-parallel converter, to all bars that are connected to the switching elements.

The switching elements are expediently field-effect transistor (FET), the gate electrodes of which are connected to the bar that is directly connected to the capacitor, or they are simply diodes. In the latter case the discharge circuit of the analog store or memory is a further diode connected to the common terminal of the switching element and the capacitor, with a polarity inverse to that of the switching diode, and connected on the other hand to the selecting circuit of the bar coupled to the capacitor or to a circuit providing a constant level. The discharge circuit of the analog store may also be a resistor connected to a voltage supply.

In a simple and therefore advantageous embodiment of the invention, the comparator is a common-emitter transistor amplifier stage, and the control electrode of the semiconductor element of the power switch is connected to a common terminal of the collector of the stage and the load resistor thereof, whereas the base of the stage is connected on the one hand to a resistor biasing the transistor of the amplifier stage towards the on-load state, and on the other hand — over a diode conected with the same polarity as the base-emitter diode of the transistor — to the common terminal of the capacitor of the analog store or memory and the switching element.

It is an advantage of the solution according to the invention that continuous brightness control can be performed over a wide contrast range without overloading the luminous elements whereas the flicker frequency remains outside the disturbing low range. The luminous elements (image points) to be energized to the highest brightness level are nearly continuously supplied which is preferred for both the lifetime of the luminous elements and the absence of flickering.

The circuit arrangement can be reduced to practice by using a relatively small number of components, i.e. in an economic manner. The brightness control of the single image points is also performed by the bars that perform the selection.

It is a special advantage of the solution according to the invention that the periodicity of the flickering amounts 100 Hz whereas the flicker frequency was lower than or, at best, equal to 50 Hz in the solutions according to prior art. The human eye is sensitive to a flickering of a frequency lower than 50 Hz, thus, the present solution practically eliminates the harmful and so far inevitable flickering phenomena, by making them imperceptible.

A further advantage consists in that the on-load rate of the energy supply for the luminous elements approximates 1,0 — for reasons of system characteristics mentioned hereinbefore — so that lower voltage peak values are acceptable for the same brightness level than in solutions according to the prior art.

Figure 2:
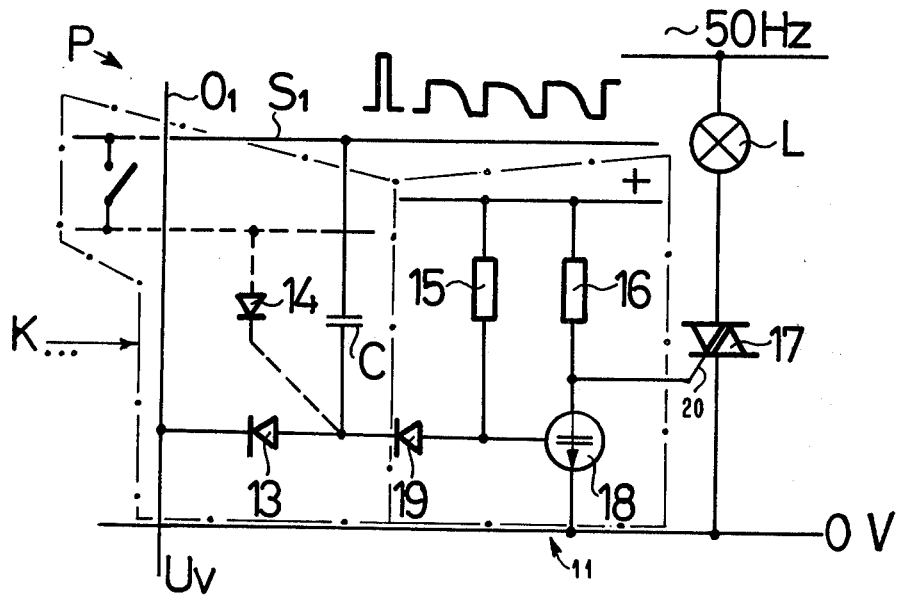

The invention will now more particularly be described, referring to the accompanying drawings, wherein FIG. 1 shows a block diagram of a circuit arrangement to perform a shaded image display according to this invention; and FIG. 2 shows a suggested circuit diagram of an inventive switching circuit for a single luminous element in the arrangement.

The circuit arrangement for performing a shaded image display is the control circuit of a display board comprising a matrix of single luminous elements L, e.g. incandescent lamps, arranged at raster points. Switching circuits P for the luminous elements are individually connected to one of row bars $S_1 \ldots S_m$ and one of channel or column bars $O_1 \ldots O_n$.

In the embodiment as shown in FIG. 1 a function generator 5, supplying a monotonously varying periodic signal, and — over gate circuits symbolized by diodes 1, 3 and resistors 2 — a row selecting circuit 4 is connected to the row bars $S_1 \ldots S_m$. In a manner conventional for display boards of this kind, the inventors use the phrase "monotonously varying period signal" as relating to one that rises and drops uniformly, changing unidirectionally in a continuous or gapless manner.

Each of the column bars ($O_1 \ldots O_n$) is connected to a separate output of a video-signal series-parallel converter 6, to some, parallel inputs of which a video-signal transmitter 7 is connected. The converter 6 comprises a number of analog store or memory elements (not shown), one for each of the column bars. Each store element is coupled to the transmitter 7 over a separate gate circuit of the latter (not shown). Other inputs of the gate circuits are connected to one of parallel outputs of a channel or column row selecting circuit 9 which is coupled with a synchronous generator 8. The selector pulses of the column selecting circuit 9 control both the data input and the readout of the earlier-mentioned analog store elements in the converter 6. The outputs of these latter store elements are respectively connected to the column bars $O_1 \ldots O_n$ over matching amplifier stages (not shown).

The switching circuit P of each luminous element L is connected to one of the row bars $S_1 \ldots S_m$ for selecting the row to which the respective luminous element belongs and also to one of the column bars $O_1 \ldots O_n$, respectively selecting the column to which the element belongs.

Each switching circuit P includes an analog store or memory 10, a comparator 11 coupled to the store 10, and a power switch 12 coupled over its control input to the comparator 11. The analog store 10 includes a capacitor C, arranged between the input of the comparator 11 and one of the bars — in our example the row bar —, whereas a switching element $K_{11} \ldots K_{mn}$ is arranged between each other bar — in our example the column bar — and respective common terminals of the capacitors C and the inputs of the comparators 11. It will be understood by those skilled in the art that the "index" portion of, for example $K_{11}$, is a composite designation for the row and column numbers, hence "$K_{11}$" for the switching element associated with the respective bars $O_1$ and $S_1$; a few of the illustrated elements are additionally designated, like $K_{21}$ in the second row and first column, and so on, ending with $K_{mn}$ in the respective last row $S_m$ and column $O_n$. The more specific, and more detailed, illustration of FIG. 2 can of course apply to any, some or all of these switching elements as shown in FIG. 1.

The switching elements are preferably field-effect transistors (FET), the gate electrodes of which are controlled over the respective bars, connected directly to their capacitors C.

The switching element may also be a diode 13 (see FIG. 2). In the latter case a separate discharge circuit must be provided for the analog store 10 of the switching circuit P. The discharge circuit is preferably constituted by another diode 14 which, on the one hand, is connected to the common terminal of the switching element $K_{11} \ldots K_{mn}$ and the capacitor C, but with a polarity inverse to that of the switching diode 13, and on the other hand, the diode 14 is also connected either to the row selecting circuit 4 or to a circuit that provides a constant voltage level (not shown). This variant is symbolized in FIG. 2 by a dotted-line embodiment showing a diode discharge circuit.

The discharge circuit may also be constituted by a resistor 15 connected to a voltage supply (a bar with a "+" symbol indicates such a connection above the resistor 15).

In FIG. 2, a preferred, exemplary embodiment of a switching circuit P is shown wherein the comparator 11 constitutes a common-emitter transistor amplifier stage, and a control electrode 20 of a semiconductor element of a power switch (equivalent of the earlier-mentioned part 12, shown in FIG. 1), in this embodiment a Triac 17 — is connected to a common terminal of a collector and the load resistor 16 of the amplifier stage 11 whereas the base of this stage is connected, on the one hand, to the resistor 15 biasing a transistor 18 of the amplifier stage (11) towards the on-load state (and serving also as the earlier-explained discharge resistor for the capacitor C) and, on the other hand, over a diode 19, connected with the same polarity as the base-emitter diode part of the transistor 18, to the common terminal of the capacitor C (of the analog memory 10) and the switching element 20 $K_{11} \ldots K_{mn}$.

An economic embodiment of the common-emitter amplifier stage can be obtained by using an IC comprising Darlington circuits.

It should be clear from the description and from the dot-dash "boxes" applied to FIG. 2 that the comparator 11 preferably encompasses, in a preferred, exemplary embodiment, the parts 15, 16, 18 and 19; the power switch 12 can be in the form of the Triac 17; and any of the switching elements K . . . may include the parts 13, 14, C, and the illustrated mechanical (or electronic) switches.

The operation of the hereinbefore circuit arrangement will now be set forth in particular. Let us assume that the video signal transmitter 7 is a TV-camera that supplies the video signal of the image to be shown on the display board for shaded images, by using the single luminous elements L arranged in a matrix, as described. In this case the generator 8 is coupled to the synchronous generator of the TV-camera so that the change of frames and rows is performed in synchronism in both the camera and the display board.

Let us take a board where there are 190 single luminous elements arranged in each of the rows, and 140 rows are arranged above each other so that a TV frame is displayed in a manner so that only the video information of every second row appears in the respective row of the display board. From the above-indicated numbers of elements in a row, and rows in the entire display, it will be clear why the indices "m" and "n" are different for the respective last bars $O_n$ and $S_m$ (and not identical), in FIG. 1 of the accompanying drawing.

A TV row is scanned into as many sections as the number of the luminous elements arranged in a single row amounts (in this case 190), and the information of any section will be stored in one of the analog store elements of the converter 6, this operation being controlled by the channel selecting circuit 9. The average value belonging to a signal section is stored in the single store elements.

The storing process is the following: the generator 8 supplies pulses of 0.25 $\mu$sec periodicity to the channel selecting circuit 9. These pulses make the circuit 9 shift, which is preferably a bistable counter chain. The output signal of the circuit 9 appears in each of its states at another one of its parallel outputs leading to the converter 6, so that in each of the states another store element of the converter 6 is prepared to receive the information present at its input, following a predetermined sequence order. Thus, all store elements of the converter are supplied during the 64 $\mu$sec row period (European CCIR standard for one row) with the video information, and at the end of the channel period the video information of the whole TV-channel is stored (scanned into 190 sections) in the converter 6. The next channel of the TV-frame is not stored. During the period of this next channel the transmission of the information may be performed, that was stored within the converter 6, to the switching circuits which information belongs to the respective channel of the display board, namely over the column bars $O_1 \ldots O_n$ that are connected to the outputs of the converter 6.

The transmission is effected by a voltage pulse that appears at that one of the outputs of the row selecting circuit 4 which belongs to the row in question, and it is performed simultaneously in all switching circuits that belong to that row.

The row selecting circuit 4 is also preferably a bistable counting chain. It is shifted by the row synchron pulses supplied to its series input. In each of its states another row bar (in a sequence from the highest row to the lowest one) is supplied with a selector pulse of a width not exceeding 64 $\mu$sec. FIG. 1 shows the circuit arrangement in a phase in which the selector pulse is supplied to the row bar $S_2$ (the switching elements being shown in their closed condition) so that the analog memories 10 of the switching circuits P belonging to the row $S_2$ receive the video information to be stored.

At the same time a monotonously varying periodic signal is present at all other — not selected — row bars $S_1, S_3 \ldots S_m$; if the energization of the luminous elements is performed by a current of mains frequency, the period of the signal amounts 10 msecs and its shape is approximately that of a quarter of a sine-wave. The effects of choosing this shape will be seen hereinafter.

As mentioned before, FIG. 2 shows a possible, preferred embodiment of the switching circuit P. The combination of the diode 19, the resistor 15, the transistor 18, and the load resistance 16 establishes the comparator (11) with a threshold level of 0 V. The home state of the comparator is the one when the transistor 18 carries current and thus blocks the semi-conductor element 17 of the power switch stage 12 (breaking) so that the luminous element L remains dark. The luminous element is an incandescent lamp supplied with half sine-waves of the mains. The power switch stage 12 is inserted into the supply line of the incandescent lamp.

The analog memory (10) of the switching circuit is the capacitor C, the input is admitted through the diode 13. During the period the row $S_1$ is selected, a voltage pulse of + 20 V amplitude is present at the row bar $S_1$. At the same time the column or channel bar $O_1$, which is connected to the diode 13, is at a potential equal to the video information that is stored in that one of the store elements of the converter 6 which is connected to the column bar $O_1$. The voltage level at column bar $O_1$ can accordingly amount to any value between 0 V and 10 V. The difference between the instant voltages at the two bars is stored in the capacitor C.

The storing operation is performed before the selector pulse disappears, and from then on the video information remains stored in the capacitor C until the beginning of the next storing operation. During this time — i.e. when no selector pulse is present — a monotonously varying periodic signal is present at the row bar $S_1$. The amplitude of this signal is 10 V at its peak, its period is half of the mains period. The instant amplitude of this signal is added to the voltage stored in the capacitor C so that the sum of the video signal and the instant value of the periodic signal controls the comparator 11.

The comparator is in the on-state until the voltage sum causes a potential at the input of the comparator not to exceed 0 V. If the video signal represents the dark state of the image point, the voltage sum will not drop below 0 V, or at most only for a very short time, short enough to prevent the lamp to glow. If the video signal that is stored into the analog store represents the highest brightness level, the voltage sum will cause a potential lower than 0 V to be present over nearly the whole image period (10 msec) at the input of the comparator 11. Thus, the control pulses appearing at the output of the switching circuit P are of an on-load rate of nearly 1.0. In the case of maximum brightness, the lamps are thus supplied with energy nearly continuously.

Let us now see again the embodiment according to FIG. 2. The capacitor C and the resistor 15 establish an RC-pad the time constant of which is chosen in a manner as to provide for a partial discharge of the capacitor C during the image period (10 msec). This solution may be sufficient if the image to be displayed varies only slowly. If the image varies quickly, after-glow (tail effect) is to be reckoned with. In order to make it possible to display even quick movements, the discharge diode 14 — shown in FIG. 2 by a dotted line — may be applied either to short circuit the capacitor C or to discharge it until a given constant voltage is reached.

The discharge diode 14 is connected to the common terminal of the capacitor C and the comparator with a polarity inverse to the one of the charging diode 13; the other terminal of the discharge diode 14 is connected either to the selecting circuit of the bar connected with the capacitor C or to any other, earlier mentioned, type of circuit that provides a constant voltage level.

The capacitors C of a certain row of the display board may be discharged during the scanning (and the storing into the converter 6) of the video information of that row of the TV-frame that precedes the row corresponding with the certain row. It can however be performed even later, i.e. at the same time when the scanning of the corresponding row takes place and the video information is supplied to the input of the converter 6.

The switching element $K_{11} \ldots K_{mn}$ that is connected to the capacitor C can be a field-effect transistor (FET) the gate electrode of which is connected to the bar $S_1 \ldots S_m$ that is directly connected to the capacitor C. That switching element is responsible for both the charging and the discharging of the capacitor C, thus, it has to carry only a charging current corresponding to the difference between the levels of two video signals that immediately follow each other.

The embodiment as specified hereinbefore is designed to operate in a manner as to convert the signals supplied by the series output of the TV-camera into parallel signals, and to transmit the video information of a whole row simultaneously to the switching circuits. This is advantageous insofar as the circuits and lines taking part in the transmission to the display bord do not have to be fitted for a wide frequency band (about 100 kHz seem to be enough) even if the bandwidth of the video channel amounts up to 5.5 MHz.

However, the circuit arrangement can be designed without the series-parallel converter 6, too. In this case the video signal is immediately supplied to the row bars $S_1 \ldots S_m$ — the supply being controlled by the row selecting circuit 4 — whereas the transfer of the video signals into the single switching circuits P, i.e. into the analog stores or memories 10 thereof, is controlled by the selector pulses appearing at the column bars $O_1 \ldots O_n$. In such embodiments the row bars and the column bars reverse their roles. The capacitors C are connected to the row bars; and the function generator 5 supplying a monotonously varying periodic signal, is also connected to the row bars.

If the display board is controlled by any of the embodiments set forth hereinbefore, and the lamps are supplied with a rectified current taken from a 50 Hz supply mains, then the gray-scale image will appear at the display board with a 100 Hz flicker frequency, i.e. practically no flickering will be perceptible. The periodic signal of the function generator 5 is synchronized to the half-period of the mains voltage, thus, there is a concordance between the voltage sum signal appearing at the input of the comparator 11 and the ignition angle of the Triac (the semiconductor element 117).

The energy supplied to the single luminous elements L is not proportional to the ignition angle but if that angle increases, the supplied energy also increases. It is expedient to establish a linear function between the light intensity of the luminous elements and the amplitude of the video signal that controls these elements. This can be obtained over the whole ignition range by an appropriate choice of the shape of the monotonously varying periodic signal supplied by the function generator 5.

In an extreme case, i.e. if the incandescent lamps are supplied with dc current and preheating is applied, the shape of the periodic signal can be a simple saw-tooth curve. If the lamps are supplied with ac current from the supply mains, the shape of the signal preferably approximates a quarter of the sine-wave curve.

What we claim is:

1. A circuit arrangement for the shaded displaying of images on display boards, the latter including single luminous elements (L) arranged in a matrix, said elements having individual switching circuits (P) connecting them to respective ones of a number of row bars ($S_1 \ldots S_m$) and of column bars ($O_1 \ldots O_n$), wherein first ($O_1 \ldots O_n$) and second ($S_1 \ldots S_m$) groups of said bars are coupled to respective selecting circuits (4, 9), and a video-signal transmitter (7) coupled to one ($O_1 \ldots O_n$) of said groups of bars for feeding information thereto; the circuit arrangement comprising, in combination: a function generator (5) for supplying a monotonously varying periodic signal, coupled to another ($S_1 \ldots S_m$) of said groups of bars; wherein at least some of said switching circuits include analog memories (10), comparators (11) having inputs and a constant threshold level, coupled to said memories, and power switches (12) coupled by way of their control inputs to said comparators; said memories including capacitors (C) that are individually connected between said comparator inputs and said another group of bars; and switching elements ($K_{11} \ldots K_{mn}$) individually inserted between said one group of bars and those terminals of said capacitors that are connected to said comparators.

2. The circuit arrangement as defined in claim 1, further comprising a video-signal series-parallel converter (6) through which said transmitter (7) is coupled to said one group ($O_1 \ldots O_n$) of bars.

3. The circuit arrangement as defined in claim 2, further comprising at least one store element forming part of said converter (6) for coupling said one group ($O_1 \ldots O_n$) of bars to one (9) of said selecting circuits (4, 9).

4. The circuit arrangement as defined in claim 1, wherein at least some of said switching elements ($K_{11} \ldots K_{mn}$) are FET-type transistors having gate electrodes that are controlled by way of said other group ($S_1 \ldots S_m$) of bars.

5. The circuit arrangement as defined in claim 1, wherein at least some of said switching elements ($K_{11} \ldots K_{mn}$) are switching diodes (13), further comprising discharge circuits for said capacitors (C) in said analog memories (10), in the form of other diodes (14) which latter are connected, on the one hand, to first terminals that are common to said switching elements and said capacitors, with a polarity inverse to that of said switching diodes and, on the other hand, to one (4) of said selecting circuits (4, 9).

6. The circuit arrangement as defined in claim 1, wherein at least some of said switching elements ($K_{11} \ldots K_{mn}$) are switching diodes (13), further comprising discharge circuits for said capacitors (C) in said analog memories (10), in the form of first resistors (15) which latter are connected to a voltage supply.

7. The circuit arrangement as defined in claim 6, wherein at least some of said comparators (11) constitute amplifier stages that include transistors (18) and load resistors (16), and at least some of said power switches (12) being constituted by semiconductor elements (17) having control electrodes (20) which latter are connected to second terminals that are common to collectors of said amplifier stages and to said load resistors, whereas bases of said stages are connected, on the one hand, to said first resistors (15) for biasing said transistors towards their on-load state and, on the other hand, to said first common terminals over auxiliary diodes (19) that are connected with the same polarity as base-emitter diode parts of said transistors.

* * * * *